US010770541B2

(12) United States Patent
Hirler et al.

(10) Patent No.: US 10,770,541 B2
(45) Date of Patent: *Sep. 8, 2020

(54) SEMICONDUCTOR DEVICE INCLUDING SUPER JUNCTION STRUCTURE

(71) Applicant: Infineon Technologies Austria AG, Villach (AT)

(72) Inventors: Franz Hirler, Isen (DE); Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/394,653

(22) Filed: Apr. 25, 2019

(65) Prior Publication Data
US 2019/0252492 A1 Aug. 15, 2019

Related U.S. Application Data

(63) Continuation of application No. 15/685,324, filed on Aug. 24, 2017, now Pat. No. 10,319,810.

(30) Foreign Application Priority Data

Aug. 25, 2016 (DE) .................. 10 2016 115 758

(51) Int. Cl.
*H01L 29/06* (2006.01)
*H01L 29/66* (2006.01)
(Continued)

(52) U.S. Cl.
CPC ...... *H01L 29/0634* (2013.01); *H01L 29/0623* (2013.01); *H01L 29/36* (2013.01);
(Continued)

(58) Field of Classification Search
CPC ........... H01L 29/7802; H01L 29/66712; H01L 29/36; H01L 29/66681; H01L 29/7816;
(Continued)

(56) References Cited

U.S. PATENT DOCUMENTS 8,183,666 B2   5/2012  Schulze
2004/0206989 A1* 10/2004  Aida ................... H01L 29/0634
                                                                    257/263

(Continued)

FOREIGN PATENT DOCUMENTS

CN   101300679 A   11/2008
CN   101510561 B    8/2010
(Continued)

OTHER PUBLICATIONS

Weber, Hans, "Herstellungsverfahren für ein Kompensationsbauelement / Verfahren zur definierten Ladungstrennung bei doppelt dotierter Ausgangsepischicht", Siemens Technik Report, vol. 5, No. 17, Jun. 1, 2002, pp. 1-5.

*Primary Examiner* — Shahed Ahmed
(74) *Attorney, Agent, or Firm* — Murphy, Bilak & Homiller, PLLC

(57) ABSTRACT

A semiconductor device of an embodiment includes transistor cells in a transistor cell area of a semiconductor body. A super junction structure in the semiconductor body includes a plurality of drift sub-regions and compensation sub-regions of opposite first and second conductivity types, respectively, and alternately arranged along a lateral direction. A termination area outside the transistor cell area between an edge of the semiconductor body and the transistor cell area includes first and third termination sub-regions of the first conductivity type, respectively. A second termination sub-region of the second conductivity type is sandwiched between the first and the third termination (Continued)

sub-regions along a vertical direction perpendicular to a first surface of the semiconductor body.

16 Claims, 12 Drawing Sheets

(51) Int. Cl.
    *H01L 29/78*     (2006.01)
    *H01L 29/36*     (2006.01)
    *H01L 29/417*    (2006.01)

(52) U.S. Cl.
    CPC .. *H01L 29/66681* (2013.01); *H01L 29/66712* (2013.01); *H01L 29/66727* (2013.01); *H01L 29/7802* (2013.01); *H01L 29/7811* (2013.01); *H01L 29/7816* (2013.01); *H01L 29/41766* (2013.01)

(58) Field of Classification Search
    CPC ............. H01L 29/7811; H01L 29/0696; H01L 21/308; H01L 21/02639; H01L 29/41741; H01L 29/0615; H01L 29/063–0634
    See application file for complete search history.

(56) References Cited

U.S. PATENT DOCUMENTS

| | | | |
|---|---|---|---|
| 2008/0179671 A1* | 7/2008 | Saito | H01L 29/0634 |
| | | | 257/341 |
| 2014/0001514 A1 | 1/2014 | Schulze et al. | |
| 2014/0264477 A1* | 9/2014 | Bhalla | H01L 29/0619 |
| | | | 257/263 |
| 2015/0162192 A1* | 6/2015 | Schulze | H01L 21/02164 |
| | | | 438/514 |
| 2015/0380542 A1* | 12/2015 | Weyers | H01L 29/0634 |
| | | | 257/329 |
| 2016/0308037 A1* | 10/2016 | Sakata | H01L 29/0619 |
| 2017/0047319 A1* | 2/2017 | Naito | H01L 21/8234 |
| 2018/0012994 A1* | 1/2018 | Loechelt | H01L 29/0634 |

FOREIGN PATENT DOCUMENTS

| | | |
|---|---|---|
| DE | 102009038731 A1 | 7/2010 |
| DE | 102010060229 A1 | 5/2011 |
| JP | 2008124346 A | 5/2008 |
| JP | 2010219341 A | 9/2010 |
| KR | 20040027352 A | 4/2004 |

\* cited by examiner

SEMICONDUCTOR DEVICE INCLUDING SUPER JUNCTION STRUCTURE

PRIORITY CLAIM

This application is a continuation of and claims priority to U.S. application Ser. No. 15/685,324 filed on Aug. 24, 2017, which in turn claims priority to German Patent Application No. 102016115758.9 filed on Aug. 25, 2016, the contents of which are incorporated by reference herein in its entirety.

BACKGROUND

Semiconductor devices known as charge compensation or super junction (SJ) semiconductor devices, for example SJ insulated gate field effect transistors (SJ IGFETs) are based on mutual space charge compensation of n- and p-doped regions in a semiconductor substrate or body allowing for an improved trade-off between area-specific on-state resistance Ron×A and breakdown voltage Vbr between load terminals such as source and drain. Performance of charge compensation of SJ semiconductor devices depends on precision when setting a lateral or horizontal charge balance by the n-doped and p-doped regions and when reducing an electric field strength in an area outside a transistor cell area.

It is desirable to improve a super junction semiconductor device in regard to performance and to provide a related super junction semiconductor device.

SUMMARY

The present disclosure relates to a semiconductor device comprising transistor cells in a transistor cell area of a semiconductor body. The semiconductor device further comprises a super junction structure in the semiconductor body. The super junction structure comprises a plurality of drift sub-regions and compensation sub-regions of opposite first and second conductivity types, respectively, and alternately arranged along a lateral direction. The semiconductor device further comprises a termination area outside the transistor cell area between an edge of the semiconductor body and the transistor cell area. The termination area comprises first and third termination sub-regions of the first conductivity type, respectively, and a second termination sub-region of the second conductivity type sandwiched between the first and third termination sub-regions along a vertical direction perpendicular to a first surface of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1:
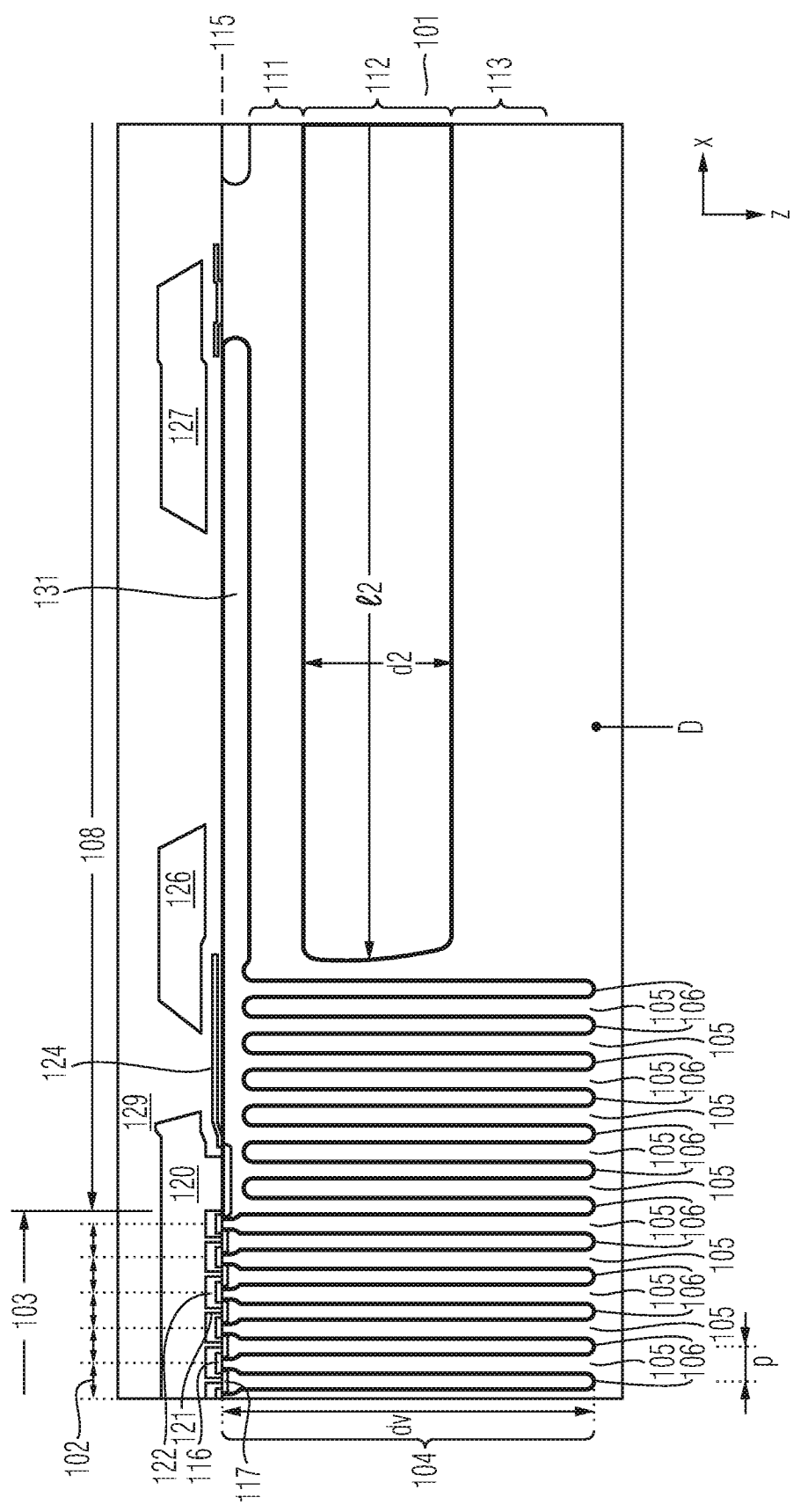
FIGS. 1, 2 and 3A to 3C are schematic cross sectional views of a semiconductor body for illustrating embodiments of a termination area of a super junction semiconductor device.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s)

adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIG. 1 is a schematic cross sectional view of a semiconductor body 101 for illustrating a part of a semiconductor device according to an embodiment.

The semiconductor device includes transistor cells 102 in a transistor cell area 103 of the semiconductor body 101. The semiconductor device further comprises a super junction structure 104 in the semiconductor body 101. The super junction structure 104 comprises a plurality of drift sub-regions 105 and compensation sub-regions 106 of opposite first and second conductivity types, respectively. The drift sub-regions 105 and compensation sub-regions 106 are alternately arranged along a lateral direction x. The semiconductor device further comprises a termination area 108 outside the transistor cell area 103 between an edge of the semiconductor body 101 and the transistor cell area 103. The termination area 108 comprises first and third termination sub-regions 111, 113 of the first conductivity type, respectively, and a second termination sub-region 112 of the second conductivity type sandwiched between the first and third termination sub-regions 111, 113 along a vertical direction z perpendicular to a first surface 115 of the semiconductor body 101.

Planar gate structures 116 including a gate electrode and a gate dielectric are formed at the first surface 115 of the semiconductor body 101 in the transistor cell area 103. According to other embodiments, the planar gate structures 116 are replaced by trench gate structures. In trench gate structures, a gate dielectric lining walls of a trench electrically separates the gate electrode and a part of the semiconductor body surrounding the trench. Optional field electrode(s) and field dielectric(s) may be arranged in the trench, for example.

Body and source regions 117 are formed in the semiconductor body 101 at the first surface 115 and are electrically coupled to a source electrode 120 via contacts 121, for example via contact plugs or contact lines extending through an intermediate dielectric 122 arranged between the source electrode 120 and the first surface 115. The transistor cell area 103 ends and the termination area 108 begins where transistor cells 102 are no longer operational, for example because of missing contacts 121 to the body and source regions 117, and/or missing body and source regions 117, and/or missing gate structures 116, for example. A gate connection structure 124 may be arranged in the termination area 108 and fully or partly surround the transistor cell area 103 for providing an electric interconnection between the planar or trench gate structures 116 and a gate pad, for example. A gate ring structure 126 and drain ring structure 127 may be positioned above first surface 115 for providing a localized entry of equipotential lines into a dielectric material 129 arranged between the gate and drain ring structures 126, 127.

The second termination sub-region 112 allows for an improved use of a semiconductor volume in the termination area 108 with respect to voltage absorption. In termination areas without the second termination sub-region 112, a characteristic of the equipotential lines is mainly determined by termination structure(s) close to the first surface 115, for example by field plate structures and/or junction termination extension (JTE) regions. Thus, a part of the semiconductor body 101 below the drain ring structure 127 and a part of the semiconductor body 101 between the drain ring structure 127 and a dicing edge do not or only to a minor extent contribute to voltage absorption. In the embodiment illustrated in FIG. 1, the second termination sub-region 112 allows for shaping a curvature of equipotential lines. Hence, a volume of the semiconductor body 101 below the drain ring structure 127 can be utilized for voltage absorption. Thereby, a size of the termination area 108 may be reduced.

In some embodiments, an extension d2 of the second termination sub-region 112 along the vertical direction z ranges between 20% and 80% of a vertical distance dv between a bottom side of the compensation sub-regions 106 and the first surface 115.

In some embodiments, the second termination sub-region 112 is electrically floating. An electrically floating second termination sub-region 112 may be formed by merging the surrounding first and third termination sub-regions 111, 113 to fully surround the second termination sub-region 112, for example.

In some embodiments, the second termination sub-region 112 is of the second conductivity type and includes dopants of the second conductivity type partially compensated by dopants of the first conductivity type. Pairs of dopants of the first and second conductivity types may correspond to As and B, As and Al, Sb and B, Sb and Al, P and Al.

In some embodiments, the first and third termination sub-regions 111, 113 are each of the first conductivity type and include dopants of the first conductivity type partially compensated by dopants of the second conductivity type. A pair of dopants of the first and second conductivity types in each of the first and third termination sub-regions 111, 113 may correspond to the pair of dopants of the first and second conductivity types in the second termination sub-region 112 although a number of dopants of the first conductivity type exceeds a number of dopants of the second conductivity type in each of the first and third termination sub-regions 111, 113, thereby setting a net doping of the first conductivity type in each of the first and third termination sub-regions 111, 113, and a number of dopants of the second conductivity type exceeds a number of dopants of the first conductivity type in the second termination sub-region 112, thereby setting a net doping of the second conductivity type in the second termination sub-region 112. By way of example, a number of As dopants may exceed a number of B dopants in each of the first and third termination sub-regions 111, 113, thereby setting a net n-type doping in each of the first and third termination sub-regions 111, 113, and a number of B dopants may exceed a number of As dopants in the second termination sub-region 112, thereby setting a net p-type doping in the second termination sub-region 112.

In some embodiments, a compensation ratio (degree of compensation) may change from lightly p-loaded in an upper portion of the super junction structure 104 to lightly n-loaded in a lower portion of the super junction structure, the lower portion having a larger distance to the first surface 115 than the upper portion. Hence, the electric charges of stationary charges in the drift sub-regions 105 and the compensation sub-regions 106, for example ionized dopant atoms, do not perfectly compensate for each other. The n- and/or p-loading may be set, for example during multiple epitaxial growth of semiconductor sub-layers and ion implantation of dopants into the semiconductor sub-layers in both the transistor cell area 103 and the termination area 108.

In some embodiments, the second termination sub-region 112 surrounds the transistor cell area 103.

In some embodiments, each of the drift sub-regions 105 includes dopants of the first conductivity type partially compensated by dopants of the second conductivity type. Likewise, each of the compensation sub-regions 106 includes dopants of the second conductivity type partially compensated by dopants of the first conductivity type. A pair of dopants of the first and second conductivity types in the drift sub-regions 105 may correspond to the pair of dopants of the first and second conductivity types in the compensation sub-regions 106 although a number of dopants of the first conductivity type exceeds a number of dopants of the second conductivity type in the drift sub-regions 105, thereby setting a net doping of the first conductivity type in the drift sub-regions 105, and a number of dopants of the second conductivity type exceeds a number of dopants of the first conductivity type in the compensation sub-regions 106, thereby setting a net doping of the second conductivity type in the compensation sub-regions 106. By way of example, a number of As dopants may exceed a number of B dopants in the drift sub-regions 105, thereby setting a net n-type doping in the drift sub-regions 105, and a number of B dopants may exceed a number of As dopants in the compensation sub-regions 106, thereby setting a net p-type doping in the compensation sub-regions 106.

In some embodiments, a same pair of dopants of the first and second conductivity types may be present in each of the drift sub-regions 105, the compensation sub-regions 106, and the first to third termination sub-regions 111, 112, 113.

In some embodiments, a maximum of a concentration profile of the pair of dopants of the first and second conductivity types in the drift sub-regions 105 along the lateral direction x is located in a center of each of the drift sub-regions 105.

In some embodiments, a concentration profile of the pair of dopants of the first and second conductivity types at an interface between the drift sub-regions 105 and the compensation sub-regions 106 is decreasing along the lateral direction x from the drift sub-regions 105 to the compensation sub-regions 106.

In some embodiments, the semiconductor device is vertical power transistor comprising a first load terminal contact at the first surface of the semiconductor body, for example the source electrode 120 at the first surface 115 of the semiconductor body 101 illustrated in the embodiment of FIG. 1, and a second load terminal contact at a second surface of the semiconductor body opposite to the first surface, for example a drain contact D illustrated in the embodiment of FIG. 1.

In some embodiments, a fourth termination sub-region 131 of the second conductivity type is sandwiched between the first termination sub-region 111 and the first surface 115.

Figure 2:
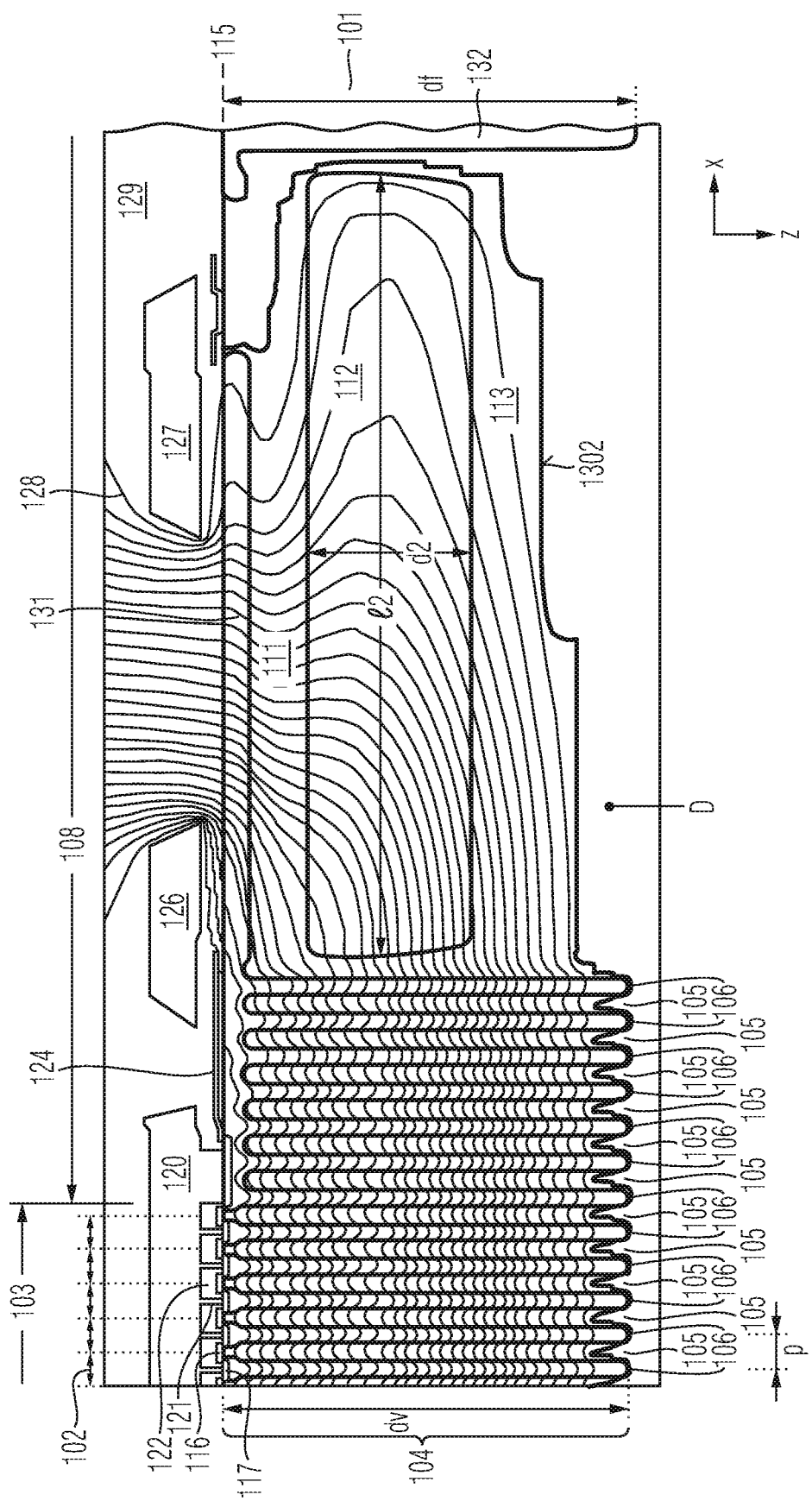

Referring to the embodiment of a semiconductor device illustrated in the cross sectional view of FIG. 2, a field stop region 132 of the first conductivity type is formed between an edge of the semiconductor body 101 and the second termination sub-region 112. The field stop region 132 is configured to improve a voltage blocking capability of the termination area 108, and, together with the second termination sub-region 112, causes a curvature of equipotential lines 128 toward the first surface 115 in an area between the source ring structure 126 and the drain ring structure 127, thereby keeping the equipotential lines 128 away from chip edges. Thereby, an electric path configured to guide a drain potential from a rear side of the semiconductor body 101 to the first surface 115 is provided, hindering the space charge region to extend to the chip edges at operation conditions based on applied blocking voltages.

In some embodiments, an extension 12 of the second termination sub-region 112 ranges between 3×p and 15×p, p being a pitch of the compensation sub-regions 106.

In some embodiments, a vertical extension d2 of the field stop region 132 ranges between 50% and 110% of the vertical distance dv between a bottom side of the compensation sub-regions 106 and the first surface 115. Thereby, an effective blocking capability of the termination region may be achieved.

A boundary 1302 of a space charge region illustrated in FIG. 2 is located in the termination area 108 slightly closer to the first surface 115 than in the transistor cell area 103. Thus, less semiconductor volume is available for absorption of blocking voltage.

Measures for increasing the semiconductor volume available for absorption of blocking voltage in the termination area 108 will be described with reference to FIGS. 3A to 3D. The schematic cross sectional view of FIG. 3A is similar to FIG. 2 and does not include any additional measures for increasing the semiconductor volume available for absorption of blocking voltage in the termination area 108 compared with FIG. 2.

Figure 3A:
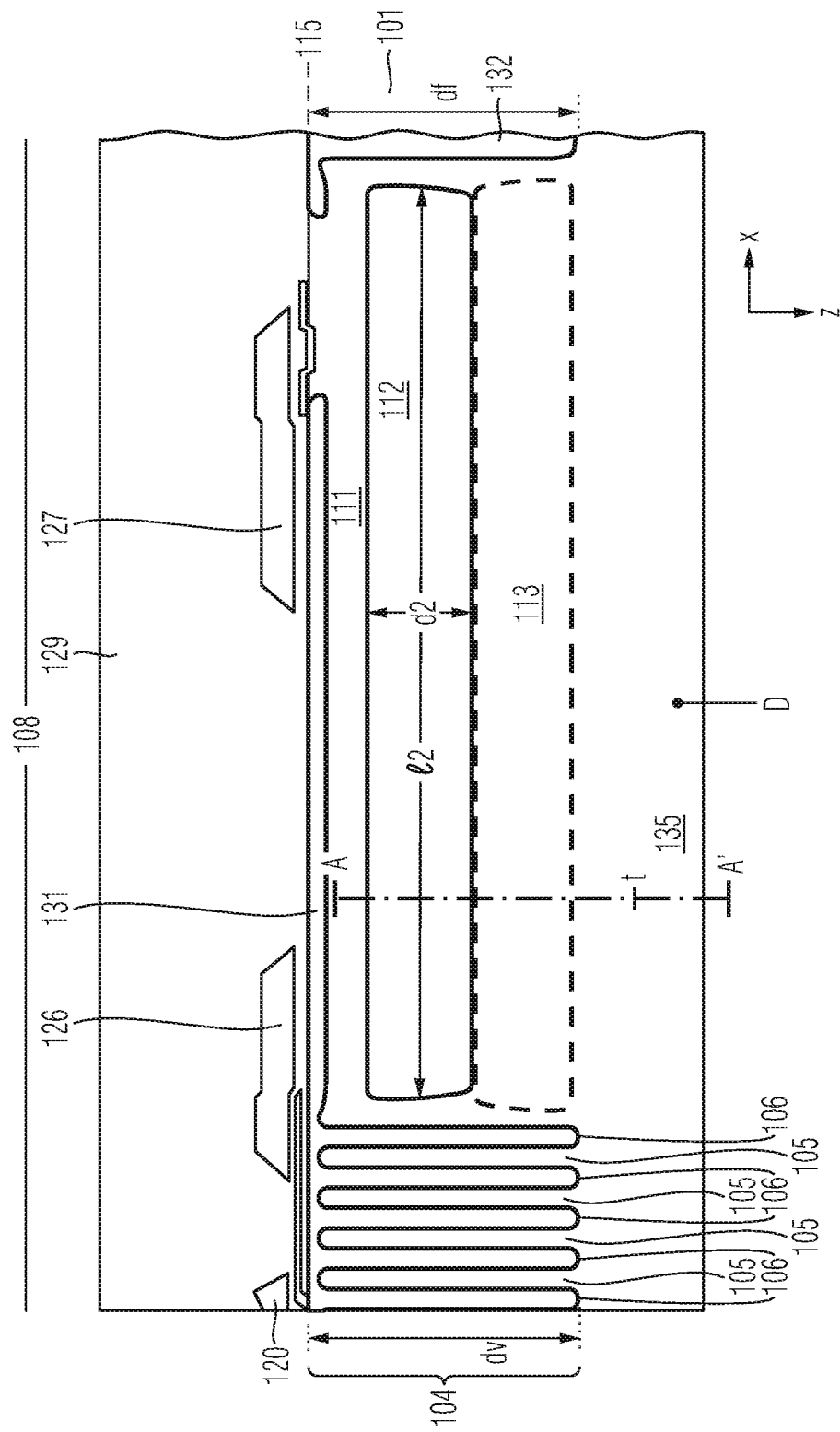
Figure 3B:
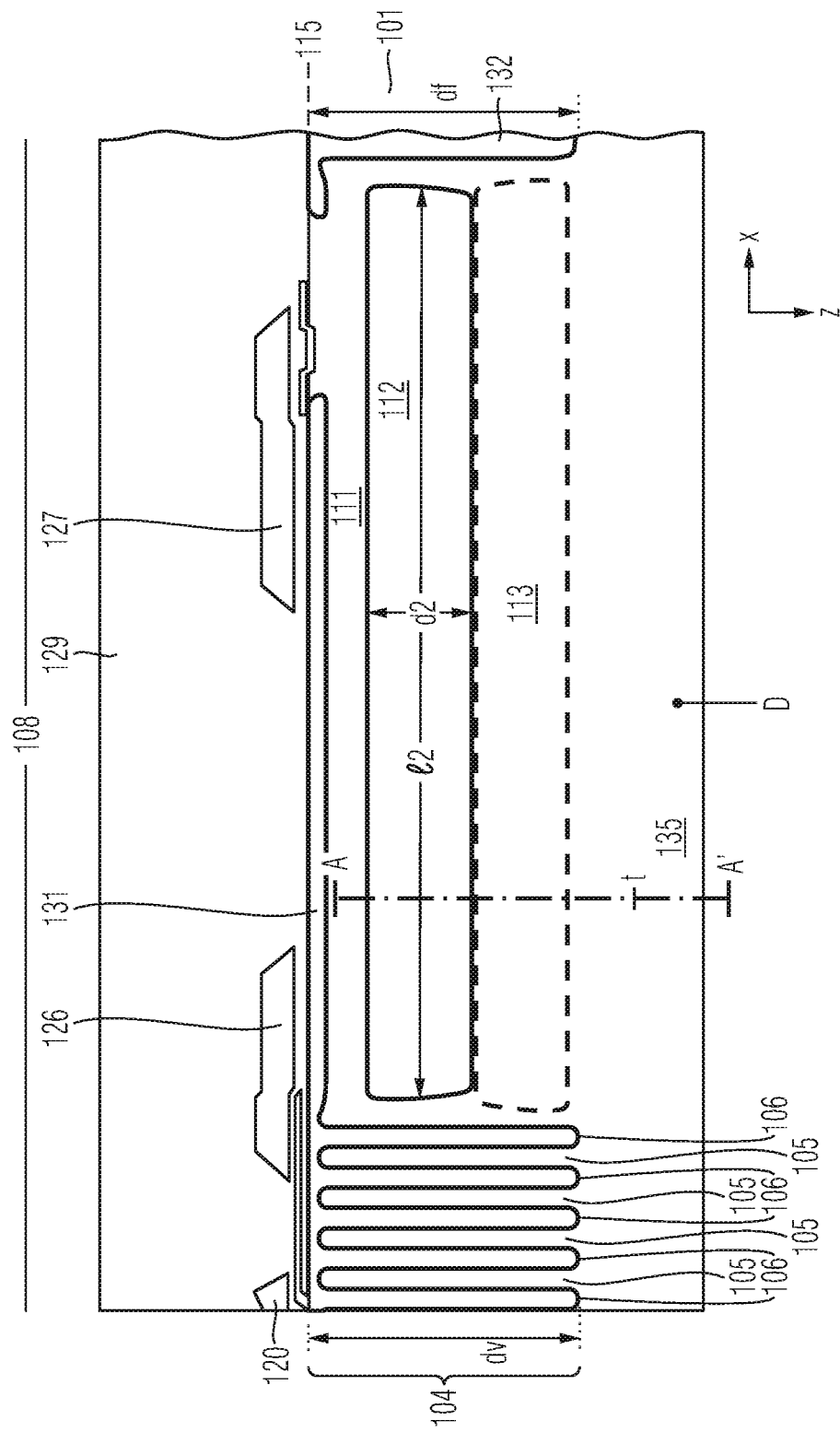

The schematic cross sectional view of FIG. 3B illustrates a cross sectional view of the semiconductor body 101 including an additional measure for increasing the semiconductor volume available for absorption of blocking voltage in the termination area 108 compared with FIG. 3A. In the embodiment of FIG. 3B, a masked implantation of dopants of the second conductivity type, for example before multiple epitaxial growth of sub-layers introduces the dopants into at least part of or all of the termination area 108 at a vertical level of or close to the bottom side of the compensation sub-regions 106 but is masked with respect to the transistor cell area 103. A dose of the dopants of the second conductivity type is set appropriately to increase the partial compensation of the third termination sub-region 113. Thus, a doping profile of the third termination sub-region 113 illustrated in FIG. 3B differs from the doping profile of the third termination sub-region 113 illustrated in FIG. 3A (see, for example, FIG. 3D). In some embodiments, the dose is in a range of $10^{12}$ cm$^{-2}$ to $2\times10^{13}$ cm$^{-2}$, for example, or in a range of $10^{12}$ cm$^{-2}$ to $5\times10^{12}$ cm$^{-2}$.

Figure 3C:
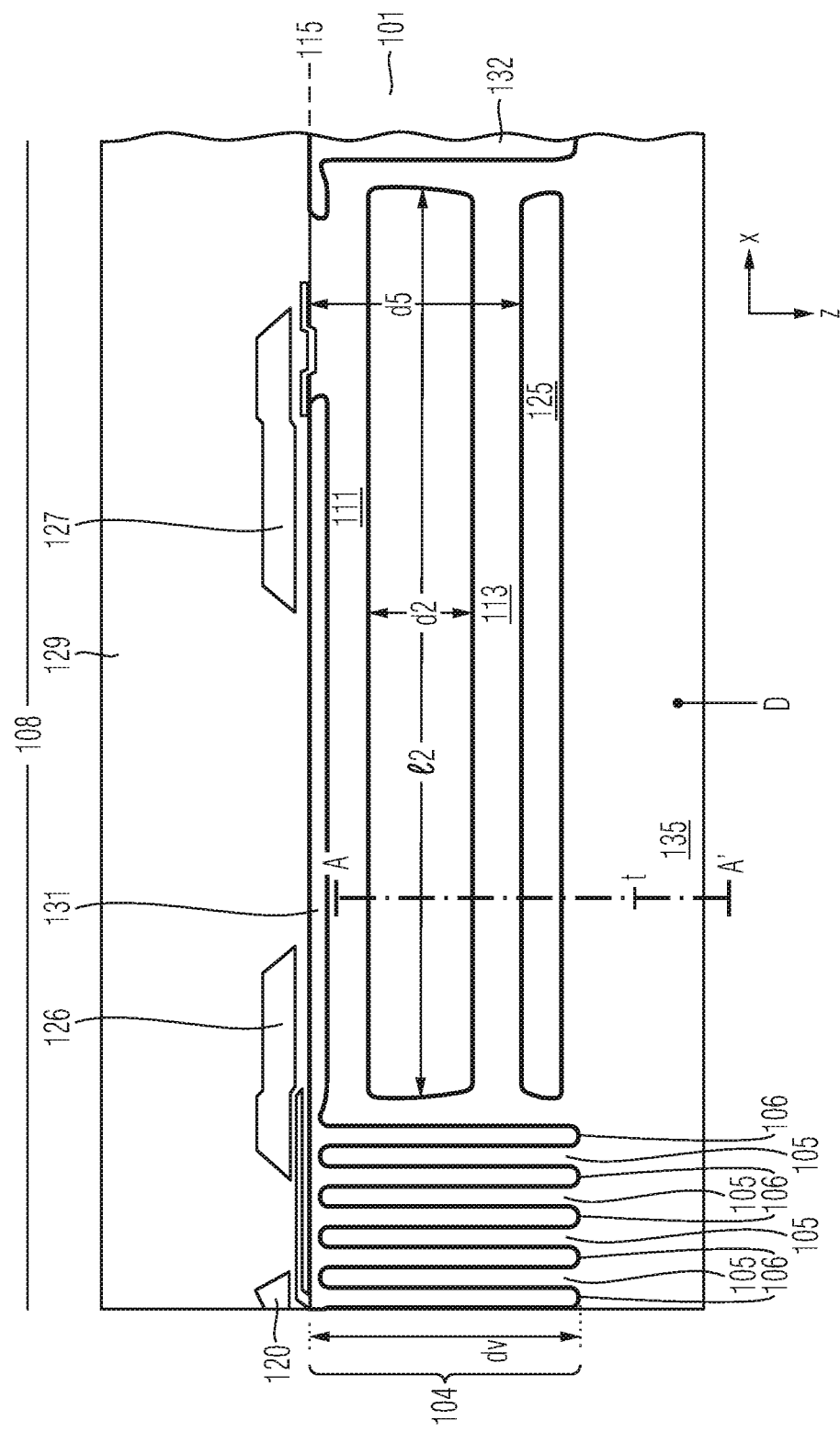

The schematic cross sectional view of FIG. 3C illustrates a cross sectional view of the semiconductor body 101 including a further additional measure for increasing the semiconductor volume available for absorption of blocking voltage in the termination area 108 compared with FIG. 3A. In the embodiment of FIG. 3C, a masked implantation of dopants of the second conductivity type introduces the dopants into at least part of or all of the termination area 108 but is masked with respect to the transistor cell area 103. A dose of the dopants of the second conductivity type is set appropriately to achieve counter-doping of part of the third termination sub-region 113, thereby forming a fifth termination sub-region 125 of the second conductivity type sandwiched between the third termination sub-region 113 and a semiconductor substrate 135 of the first conductivity type. In some embodiments, a vertical distance d5 between the fifth termination sub-region 125 and the first surface 115 ranges between 80% and 100% of the vertical distance dc between the bottom side of the compensation sub-regions 106 and the first surface 115.

Figure 3D:
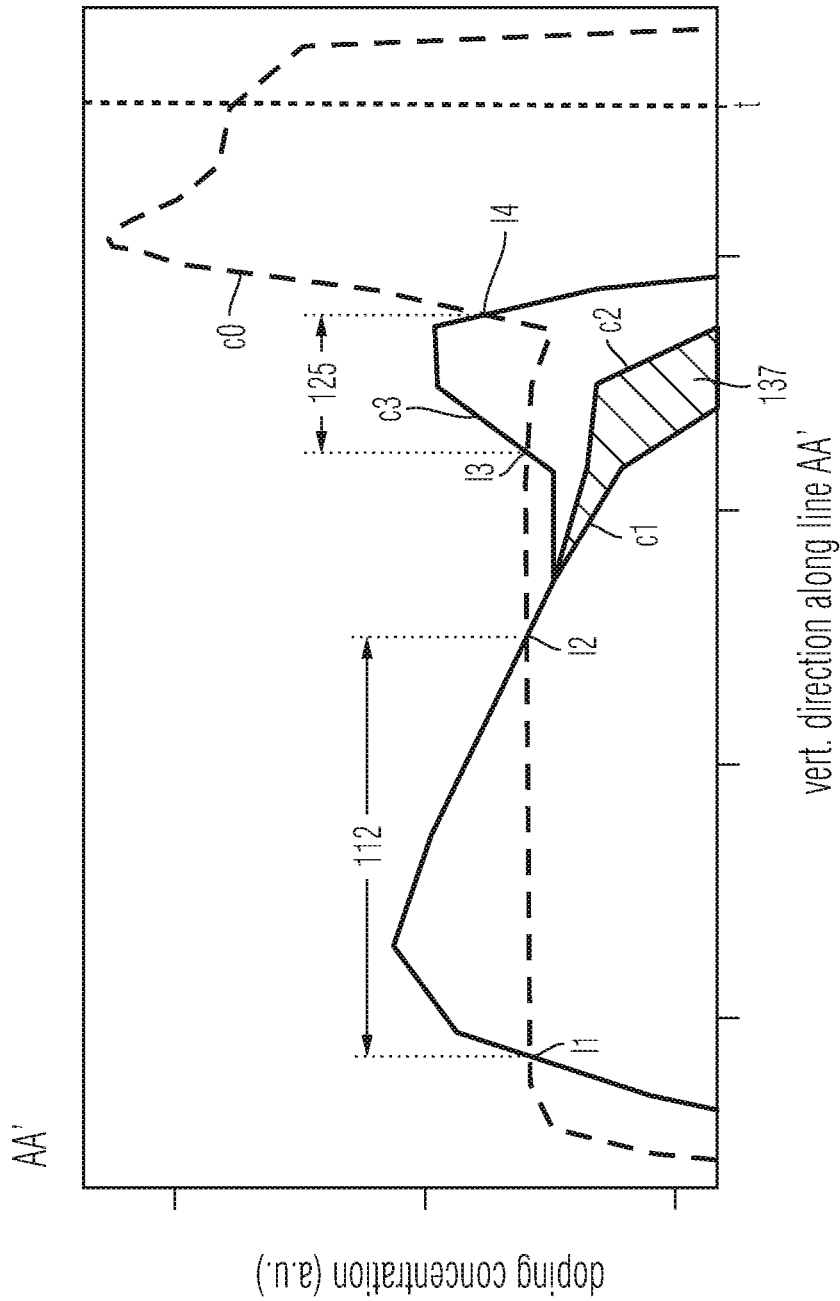
FIG. 3D is a graph for illustrating doping concentration profiles along line AA' of FIGS. 3A to 3C.

Doping concentration curves along cut line AA' of FIGS. 3A to 3C are illustrated in the graph of FIG. 3D. Doping concentration curve c0 illustrates a concentration of dopants of the first conductivity type along the cut line AA' of FIGS. 3A to 3C, apart from dopants of the first conductivity type associated with a background doping of a carrier substrate extending toward a second surface of the semiconductor body starting from a depth position t. Doping concentration curve c1 illustrates a concentration of dopants of the second conductivity type along the cut line AA' of FIG. 3A. Between intersection points I1 and I2 of the curves c0 and c1, the second termination sub-region 112 is located. Doping concentration curve c2 illustrates a concentration of dopants of the second conductivity type along the cut line AA' of FIG. 3B. Hatched area 137 illustrates the increase of the partial compensation of the third termination sub-region 113. Doping concentration curve c3 illustrates a concentration of dopants of the second conductivity type along the cut line AA' of FIG. 3C. Between intersection points 13 and 14 of the curves c0 and c3, the fifth termination sub-region 125 is located.

FIGS. 4A to 10 provide further details as regards process features for manufacturing semiconductor devices as illustrated in FIGS. 1 to 3C.

In some embodiments, the semiconductor body 101 includes a semiconductor layer on a semiconductor substrate, the semiconductor layer comprising n- and p-type dopants that may be formed as described below.

Figure 4A:
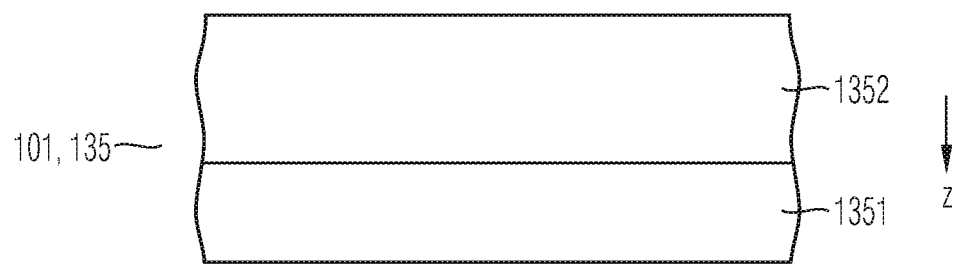
FIGS. 4A to 4C are schematic cross-sectional views for illustrating a method of forming a doped semiconductor layer on a semiconductor substrate by multiple epitaxial growth of semiconductor sub-layers and ion implantation of dopants into the semiconductor sub-layers.

Referring to the schematic cross sectional view illustrated in FIG. 4A, the semiconductor substrate 135 includes a highly doped semiconductor carrier 1351 and one or more functional semiconductor layers 1352, for example field stop region(s) and/or pedestal layer(s) for adjusting a profile of electric field strength may be provided as the semiconductor body 101. Also the dopants resulting from the masked implantation described with reference to FIG. 3C may be part of the semiconductor substrate 135.

Figure 4B:
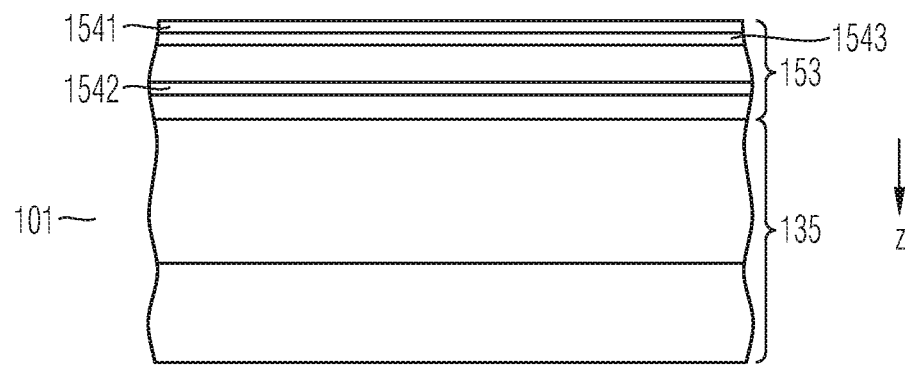
Figure 4C:
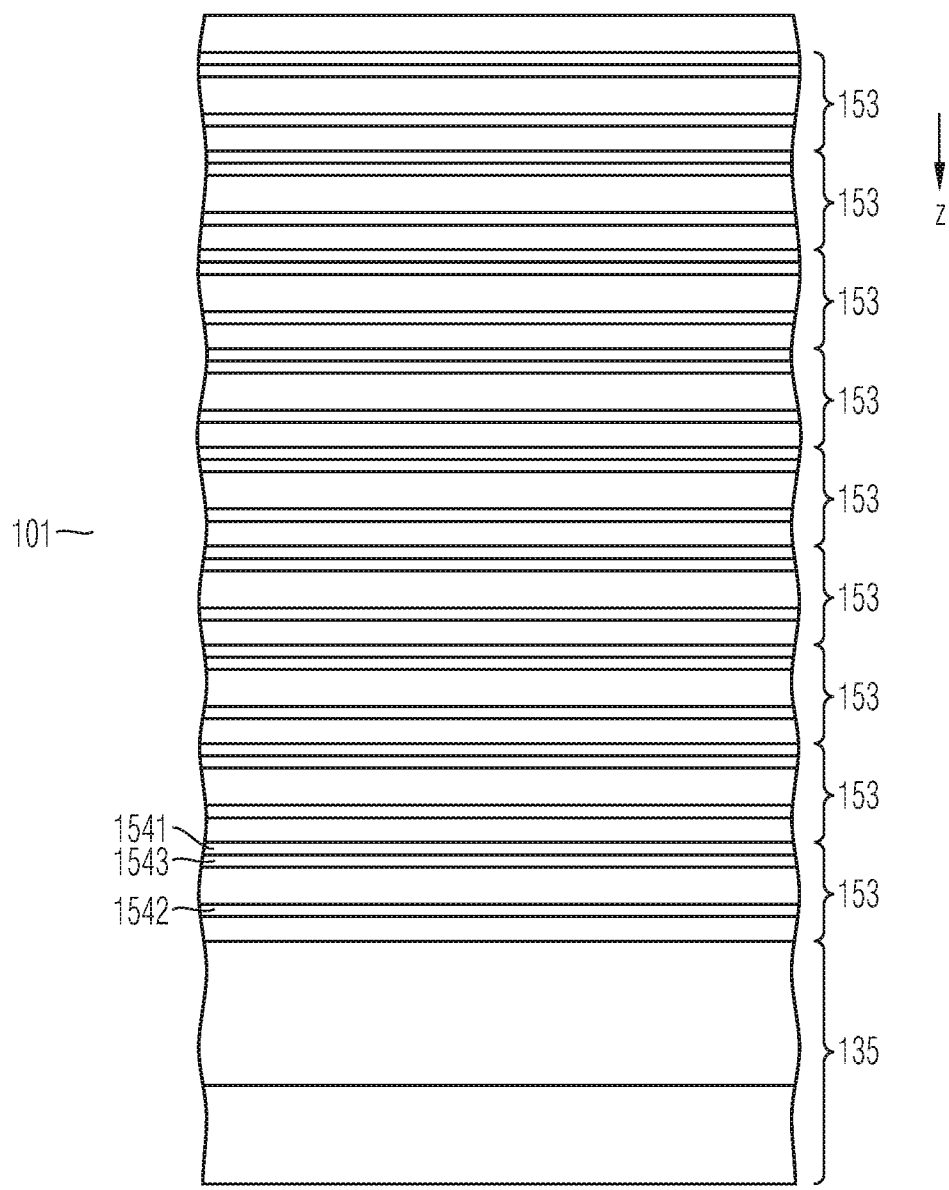

Referring to the schematic cross sectional views of FIGS. 4B and 4C, a thickness of the semiconductor body 101 is increased by forming a semiconductor sub-layer 153 on a process surface of the semiconductor body 101. N- and p-type dopants are formed within the semiconductor sub-layer 153 by implanting the n- and/or p-type dopants into the semiconductor sub-layer 153. The n- and p-type dopants may be implanted one or multiple times at one or different implant energies and/or implant doses. Ion implantation at different energies may result in different implant depths as is illustrated in FIG. 4B with respect to implant regions 1541, 1542. The implant energy associated with introduction of the dopants of the implant region 1542 is larger than the implant energy associated with the introduction of the dopants of the implant region 1541 or an implant region 1543 of opposite conductivity type than the implant regions 1541, 1542. Apart from ion implantation, other doping processes, for example in-situ doping or doping from a solid doping source may be used to form one or more of the implant regions 1541, 1542, 1543.

In some embodiments, the process surface during dopant implantation of the ion implantation processes illustrated with reference to FIG. 4B is free of an ion implantation mask in the transistor cell area, or even free of any patterned ion implantation mask anywhere on the process surface.

Referring to the schematic cross sectional view of FIG. 4C the processes of semiconductor sub-layer formation and ion implantation of n- and p-type dopants may be repeated several times for adapting a vertical extension of the super junction structure in conjunction with implantation doses of the n- and p-type dopants to a desired drain to source blocking voltage of the final device. Examples of drain to source blocking voltage or device voltage classes include blocking voltages in the range of hundreds of volts, for example 400V, 500V, 600V, 650V, 700V, 800V, 900V, 1000V. In some embodiments, a thickness of each one of the semiconductor sub-layers 153 is set in a range from 1 µm to 15 µm, for example in a range from 2 µm to 8 µm.

In some embodiments, an overall implant dose of the n- and p-type dopants into all of the semiconductor sub-layers 153 differs by at least 20%. In other words, an overall dose of the n- and p-type dopants determined by integrating a concentration of the n- and p-type dopants along a vertical extension of the super junction structure differs by at least 20%.

The semiconductor body 101 formed by the processes as described with reference to FIGS. 4A to 4C may be subject to the processes as described with reference to a diffusion process, for example a vertical diffusion process for adjusting a vertical profile of dopant concentration of the dopants introduced into the implant regions 1541, 1542, 1543.

Further processes are carried out subsequent to the processes illustrated in FIGS. 4A to 4C.

The further processes include forming the super junction structure 104 illustrated in FIGS. 1 to 3C by forming trenches in the semiconductor body 101 at positions where the drift sub-regions 105 or the compensation sub-regions 106 are to be formed, filling the trenches with an intrinsic or lightly doped semiconductor filling material, for example by an epitaxial growth process, and heating the semiconductor body 101 so as to cause a diffusion process, for example a lateral diffusion of the n- and p-type dopants introduced into the semiconductor body 101 by processes as illustrated, by way of example, in FIGS. 4A to 4C. These dopants may diffuse into the filling material at different amounts due to different diffusion velocities, thereby forming net p- and n-doped regions, for example the compensation and drift sub-regions 106, 105 of the super junction structure 104 illustrated in FIGS. 1 to 3C. Referring to the schematic cross sectional view of the semiconductor body 101 illustrated in FIG. 5, the lateral diffusion process may result in a super junction structure 143 in the transistor cell area 103 including first semiconductor zones 145a, 145b of a first conductivity type and second semiconductor zones 150a, 150b of a second conductivity type different from the first conductivity type. The first and second semiconductor zones are alternately arranged along a lateral direction extending in parallel to a front surface of the semiconductor body 101, for example along the lateral direction x illustrated in FIG. 1. The sequence of arrangement of these zones along the lateral direction is first semiconductor zone 145a, second semiconductor zone 150a, first semiconductor zone 145b, second semiconductor zone 150b.

Each of the first semiconductor zones 145a, 145b includes a first dopant species of the first conductivity type and a second dopant species of the second conductivity type. Since each of the first semiconductor zones 145a, 145b is of the first conductivity type, a concentration of the first dopant species is larger within these zones than the concentration of the second dopant species.

Each of the second semiconductor zones 150a, 150b includes the second dopant species. These second semiconductor zones 150a, 150b may also include the first dopant species in a concentration lower than the concentration of the second dopant species.

One of the first and second semiconductor zones, i.e., the first semiconductor zones 145a, 145b or the second semiconductor zones 150a, 150b, constitute drift zones of the super junction semiconductor device. A diffusion coefficient of the second dopant species is based on predominantly interstitial diffusion. As an example, the second dopant species may be boron or aluminum, for example.

Figure 5:
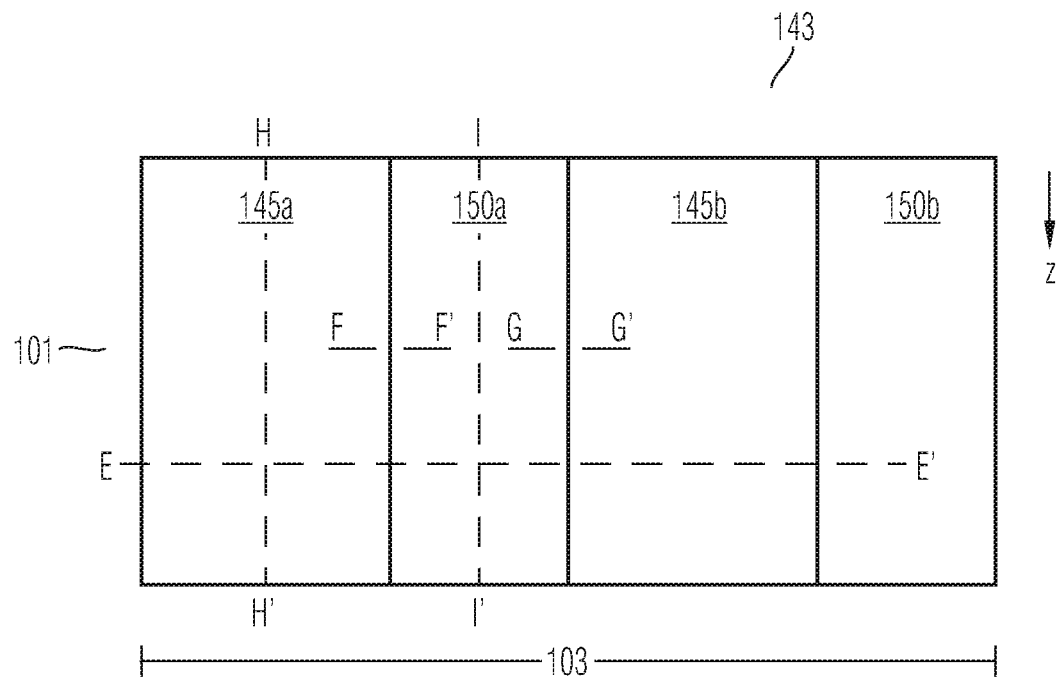
FIG. 5 illustrates one embodiment of a super junction structure in the semiconductor body including subsequently arranged first and second semiconductor zones of different conductivity type.

A super junction semiconductor device including the super junction structure 143 illustrated in FIG. 5 may include further structural elements not illustrated in FIG. 5, either because these elements are located in a device portion different from the portion illustrated in FIG. 5 or because these elements are not illustrated for reasons of clarity. Examples for these elements not illustrated in FIG. 5 depend on the type of the device and may include one or a plurality of edge termination structures, measures for increasing avalanche robustness, semiconductor structures including body and source, drain, anode, cathode, gate structures including gate dielectrics and gate electrodes, insulation dielectrics, conductive structures such as contact plugs and metal layers, for example.

The first conductivity type may be an n-type and the second conductivity type may be a p-type. As a further example, the first conductivity type may be the p type and the second conductivity type may be the n-type.

The first and second semiconductor zones 145a, 145b, 150a, 150b constitute semiconductor drift- and compensation zones of different conductivity type. In a reverse operation mode of the device, an overall space charge of at least one of the first semiconductor zones may electrically compensate the space charge of at least one of the second semiconductor zones. An electrically active dose of at least one of the first semiconductor zones may also be smaller than 20%, or 10% or even 5% than the corresponding dose of one of the second semiconductor zones, whereby dose means $\int(dN/dx)$ in the first or second semiconductor zones in the lateral direction, N being the effective or net concentration of n-type of p-type doping.

Examples of materials of the first and second dopant species may include As and B, As and Al, Sb and B, Sb and Al.

One of the first and second semiconductor zones 145a, 145b, 150a, 150b may include at least one epitaxial semiconductor layer grown on a semiconductor substrate along the vertical direction y perpendicular to a lateral direction, for example as illustrated in FIGS. 4A to 4C. The other one of the first and second semiconductor zones 145a, 145b, 150a, 150b may be arranged within the trenches formed within the semiconductor body 101. These zones may include epitaxial semiconductor layers grown on sidewalls of the trenches along the lateral direction. A width of the first semiconductor zones 145a, 145b may be greater than a width of a mesa region between neighboring trenches, for example.

The first and/or second dopant species may be implanted into the semiconductor body 101 as illustrated and described with reference to FIGS. 4A to 4C, for example.

Figure 6:
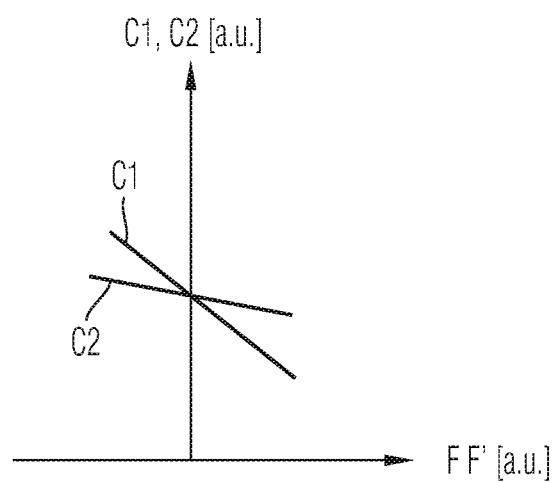
FIG. 6 illustrates a schematic diagram of an example of a concentration profile of first and second dopant species along an intersection line FF' illustrated in FIG. 5.

FIG. 6 illustrates a schematic diagram of an example of a concentration profile of the first and second dopant species C1, C2 along the lateral direction of intersection line FF' illustrated in FIG. 5.

A concentration C1 of the first dopant species having the first conductivity type is larger within the first semiconductor zone 145a (i.e., left part of graph illustrated in FIG. 6) than the concentration C2 of the second dopant species having the second conductivity type. Contrary thereto, the concentration C2 of the second dopant species is larger within the second semiconductor zone 150a (i.e., right part of graph illustrated in FIG. 6) than the concentration C1 of the first dopant species within this zone. Thus, the conductivity type of first semiconductor zone 145a corresponds to the conductivity type of the first dopant species and the conductivity of the second semiconductor zone 150a corresponds to the conductivity type of the second dopant species.

In other words, a concentration of the dopants of each of the first and second species at an interface between one of the first semiconductor zones 145a, 145b and one of the second semiconductor zones 150a, 150b is decreasing along the lateral direction from the first to the second semiconductor zones. The dopant profiles intersect at the interface, whereas a gradient of the profile is larger for the first dopant species than for the second dopant species.

Figure 7:
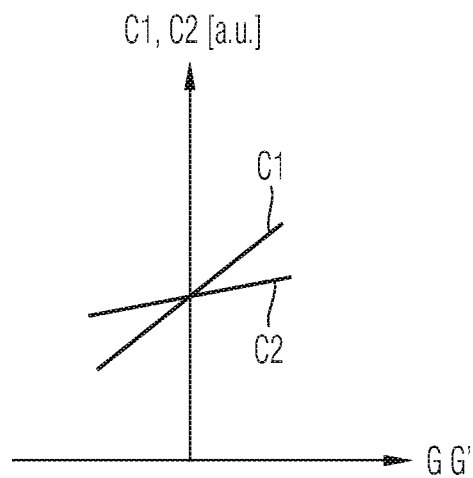
FIG. 7 illustrates a schematic diagram of an example of the concentration profile of the first and second dopant species along an intersection line GG' illustrated in FIG. 5.

FIG. 7 illustrates a schematic diagram of an example of a profile of concentration C1, C2 of the first and second dopant species along the lateral direction of intersection line GG' illustrated in FIG. 5.

A concentration C1 of the first dopant species is larger within the first semiconductor zone 145b (i.e. right part of graph illustrated in FIG. 7) than the concentration C2 of the second dopant species. Contrary thereto, the concentration C2 of the second dopant species is larger within the second semiconductor zone 150a (i.e., left part of graph illustrated in FIG. 7) than the concentration C1 of the first dopant species. Thus, a conductivity type of the first semiconductor zone 145b corresponds to the conductivity type of the first dopant species and the conductivity type of the second semiconductor zone 150a corresponds to the conductivity type of the second dopant species.

Figure 8A:
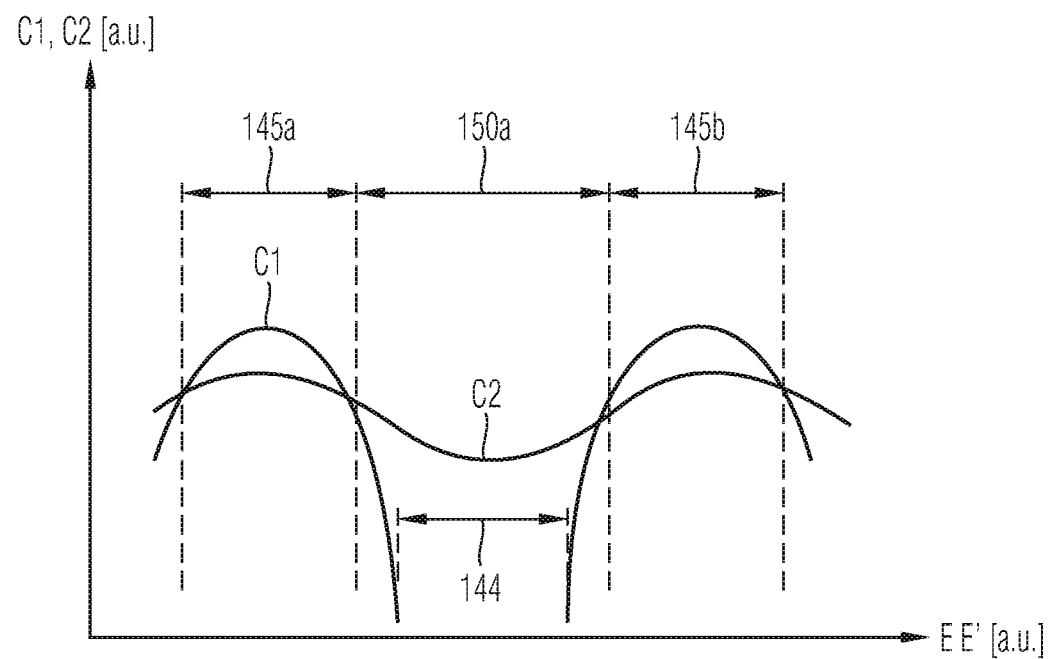
FIG. 8A illustrates a schematic diagram of a first example of a concentration profile of the first and second dopant species along an intersection line EE' illustrated in FIG. 5.

FIG. 8A illustrates one example of a profile of concentrations C1, C2 of first and second dopant species along the lateral direction of intersection line EE' of the semiconductor body 101 illustrated in FIG. 5.

An intersection area between the profile of concentration C1 of the first dopant species and the profile of concentration C2 of the second dopant species defines an interface between a first semiconductor zone such as the first semiconductor zone 145a having a concentration C1 of the first dopant species that is larger than the concentration C2 of the second dopant species and a second semiconductor zone such as second semiconductor zone 150a having a concentration C2 of the second dopant species that is larger than the concentration C1 of the first dopant species. A schematic profile of concentrations C1, C2 as illustrated in FIG. 8A may be manufactured by diffusing first and second dopant species from a volume of the first semiconductor zones such as the first semiconductor zones 145a, 145b into a volume of the second semiconductor zone such as the second semiconductor zone 150a, which may be originally undoped and formed as is illustrated in FIG. 5. A width of the first semiconductor zones 145a, 145b may be greater than a width of a mesa region between neighboring trenches, for example.

In the example illustrated in FIG. 8A, a diffusion coefficient of the second dopant species is at least twice as large as the diffusion coefficient of the first dopant species. A maximum of the concentration of dopants C1, C2 of each of first and second dopant species along the lateral direction EE' is located in the center of each of the first semiconductor zones 145a, 145b having a same lateral distance to the neighboring ones of the second semiconductor zones. A minimum of the concentration C2 of the second dopant species is located in the center of each of the second semiconductor zones such as the second semiconductor zone 150a having a same lateral distance to the neighboring ones of the first semiconductor zones such as the first semiconductor zones 145a, 145b.

In the example illustrated in FIG. 8A, a region 144 free of first dopant species remains within each of the second semiconductor zones such as the second semiconductor zone 150a. A corrugation of each of the profile of concentration C1, C2 may be influenced by a plurality of parameters such as dimensions and distance of the regions acting as a diffusion reservoir, diffusion coefficients of the respective dopant species or thermal budget and time of diffusion of the respective species, for example.

Figure 8B:
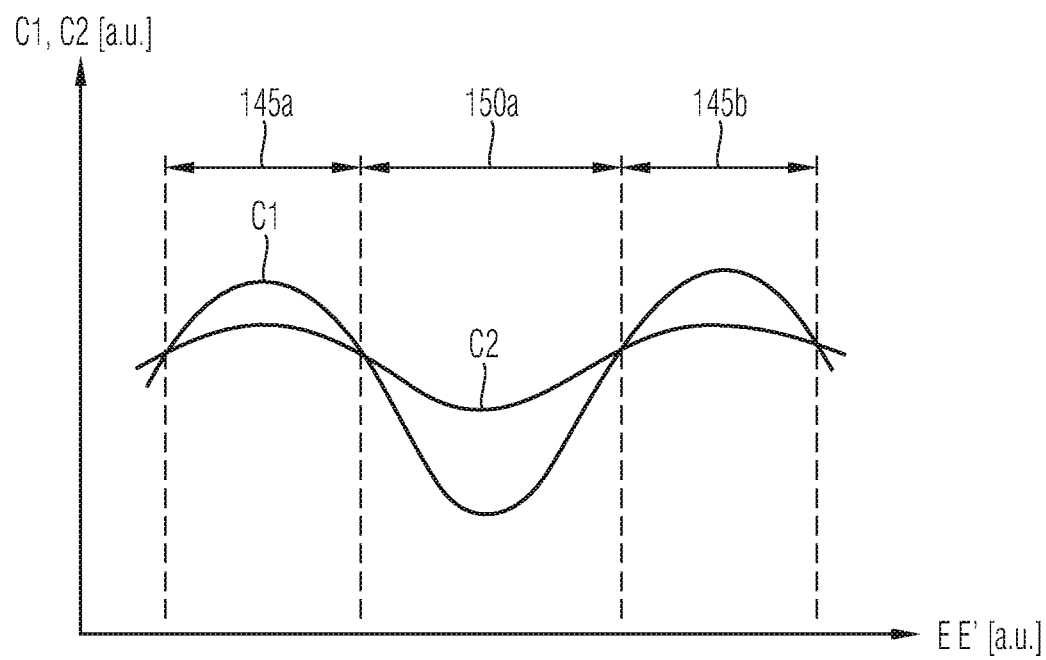
FIG. 8B illustrates a schematic diagram of a second example of the concentration profile of the first and second dopant species along the intersection line EE' of FIG. 5.

The schematic diagram of FIG. 8B illustrates another example of a profile of concentrations C1, C2 along the lateral direction of intersection line EE' of the super junction structure 143 illustrated in FIG. 5. With regard to the location of maxima and minima of the profile of concentration C2 of the second dopant species is similar to the example illustrated in FIG. 8A.

The profile of concentration C1 of the first dopant species differs from the corresponding profile illustrated in FIG. 8A in that the first dopant species are located in an overall volume of second semiconductor zones such as the second semiconductor zone 150a. Thus, diffusion of the first dopant species out of neighboring diffusion reservoirs such as reservoirs located within first semiconductor zones 145a, 145b, is effected such that the two diffusion profiles will overlap and no semiconductor volume such as the region 144 free of first dopant species remains with the second semiconductor zones such as the second semiconductor zone 150a illustrated in FIG. 8A.

Figure 9A:
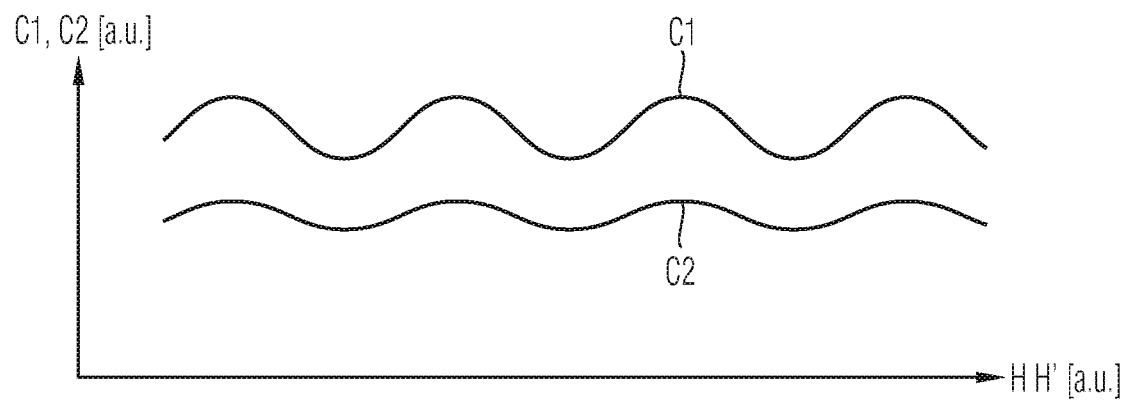
FIG. 9A illustrates a schematic diagram of a first example of a concentration profile of the first dopant and second dopant species along an intersection line HH' illustrated in FIG. 5.

FIG. 9A illustrates one example of a profile of concentrations C1, C2 of the first and second dopant species along a vertical direction z of intersection line HH' of the super junction structure 143 illustrated in FIG. 5. The profile of concentrations C1, C2 of the first and second dopant species along the vertical direction z of intersection line HH' may be set by carrying out a diffusion process, for example a vertical diffusion process before the lateral diffusion process described with reference to FIGS. 5 to 8B.

Both, the profile of concentration C1 of the first dopant species and the profile of concentration C2 of the second dopant species include maxima and minima along the vertical direction z of the intersection line HH'. The concentration C1 of the first dopant species is larger than the concentration C2 of the second dopant species. Thus, a conductivity type of this first semiconductor zone 145a equals the conductivity type of the first dopant species.

The number of maxima of the concentration profiles C1, C2 of each of the first and second dopant species along the vertical direction z of the intersection line HH' may correspond to the number of epitaxial semiconductor sub-layers formed on a semiconductor substrate, for example by processes as illustrated in FIGS. 4A to 4C. The first and second dopant species may be implanted into each of the semiconductor epitaxial layers. Each implant into one of the semiconductor epitaxial layers may be carried out after formation of the one of the semiconductor epitaxial layers and before formation of the next one of the epitaxial semiconductor layers, for example. An implant dose of the first species may be equal to the implant dose of the second dopant species. These doses may also be nearly the same differing from each other by less than 20%, or 10%, or 5%, or 3% or 1% for at least one of the epitaxial semiconductor layers. By varying the doses, for example greater p- than n-doses in an upper half of the epitaxial layer(s) and greater n- than p-doses in a lower half of the epitaxial layer(s), a charge imbalance may be adjusted, for example an imbalance caused by excess p-charge in the upper half of the epitaxial layer(s) and a charge imbalance caused by excess n-charge in the lower half of the epitaxial layer(s). As an example, by adjusting the implant doses of the first and second dopant species to different values, e.g., to above embodiment values, a production tolerance with regard to the breakdown voltage of the resulting device may be improved. The maxima of the profile of concentration C1, C2 of the first and second dopant species may be shifted from each other along the vertical direction z subject to implant energies chosen for implant of the first and second dopant species, for example. An overall implant per sub-layer may also be divided into a plurality of sub-doses at different implant energies, for example.

Associated with the example of profiles of concentration C1, C2 illustrated in FIG. 9A is a profile of concentration C1, C2 of first and second dopant species along the vertical direction z of an intersection line II' in the super junction structure 143 of FIG. 5. This profile may also include maxima and minima along the vertical direction z of the intersection line II'. In contrast to the relation C1>C2 holding true for the profiles along the vertical direction HH' illustrated in FIG. 9A, C2>C1 may apply for the profiles along the vertical direction z of intersection line II' of FIG. 5 (not illustrated in FIG. 9A).

Figure 9B:
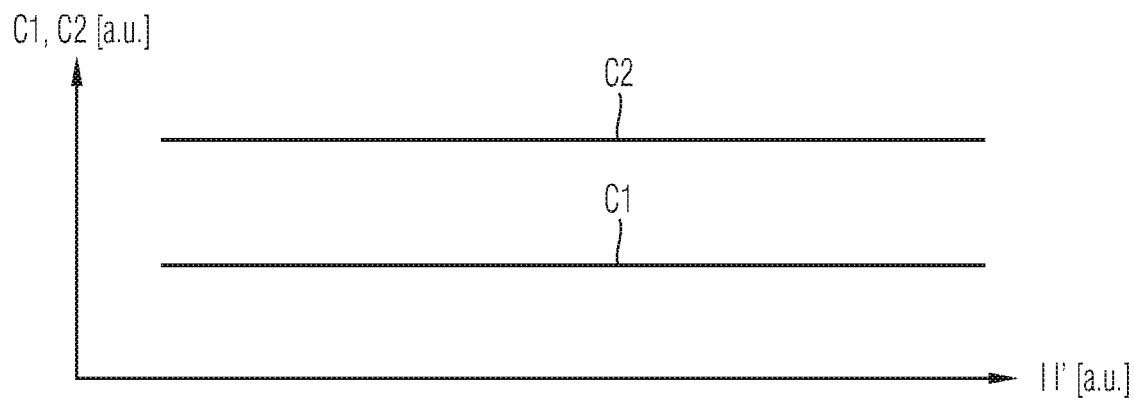
FIG. 9B illustrates a schematic diagram of a second example of the concentration profile of the first and second dopant species along an intersection line II' illustrated in FIG. 5.

FIG. 9B illustrates another example of a profile of concentrations C1, C2 along the vertical direction z of the intersection line II' in the super junction structure 143 of FIG. 5. In the embodiment illustrated in FIG. 9B, maxima caused by vertical diffusion of the dopant species are no longer present due to a constant or almost constant profile of the concentrations C1, C2.

In some other embodiments, and different from the example of profiles illustrated in FIG. 9A, the concentration profile C2 of the second dopant species having the larger diffusion coefficient includes less maxima along the vertical direction z than the concentration profile C1 of the first dopant species. This may be achieved by using plural implant energies when implanting the second dopant species and/or, when forming a plurality of semiconductor epitaxial layers constituting the first semiconductor zones 145a, 145b, by implanting the second dopant species into less of these epitaxial layers than the first dopant species. One or both of these profiles may also slightly vary along the vertical direction y, e.g. by a fraction of 5%, or 10% or 20%. Such variations may allow to improve the avalanche robustness of the device or to improve the production tolerance with regard to the breakdown voltage of the device. As an example a concentration of the one of the dopants constituting the drift zone may have a peak maximum along the vertical direction y which is higher than the other maxima, e.g., in a center of the drift zone along the vertical direction y. This example may allow for improving avalanche robustness of the device. As another example, a concentration of the one of the dopants constituting the drift zone may have a peak maximum at or close to a top side and/or bottom side of the drift zone, the peak maximum being higher than the other maxima in the vertical direction. This further example may allow for counterbalancing vertical diffusion of dopants out of the drift zones to be formed.

Associated with the example of profiles of concentration C1, C2 illustrated in FIG. 7B are profiles of concentration C1, C2 of first and second dopant species along the vertical direction z in the semiconductor body 101 of FIG. 5. In contrast to the relation C1>C2 holding true for the profiles along the vertical direction z of the intersection line HH' of FIG. 5 as is illustrated in FIG. 7A, C2>C1 may apply for the profiles along the vertical direction z along the intersection line II' of FIG. 5 as is illustrated in FIG. 7B.

Other examples of profiles of dopant concentrations C1, C2 along the vertical direction z may include parts having maxima and minima and other parts of constant dopant concentration. Such profiles may be manufactured by a combination of in-situ doping in the epitaxial layer deposition process and doping by ion implantation of dopants, for example. Further processes may follow for finalizing the super junction semiconductor device. Examples of further processes include formation of gate dielectric, gate electrode, load terminals at opposite surfaces of the semiconductor body and wiring areas, planar termination structures, for example one or more of a potential ring structure and a junction termination extension structure, thermal processing for vertical inter-diffusion of dopants of the implant regions. The vertical and lateral diffusion processes described above with reference to FIGS. 4A to 9B also result in the first to third termination sub-regions 111, 112, 113 of the termination area 108 illustrated in FIGS. 1 to 3C.

Figure 10:
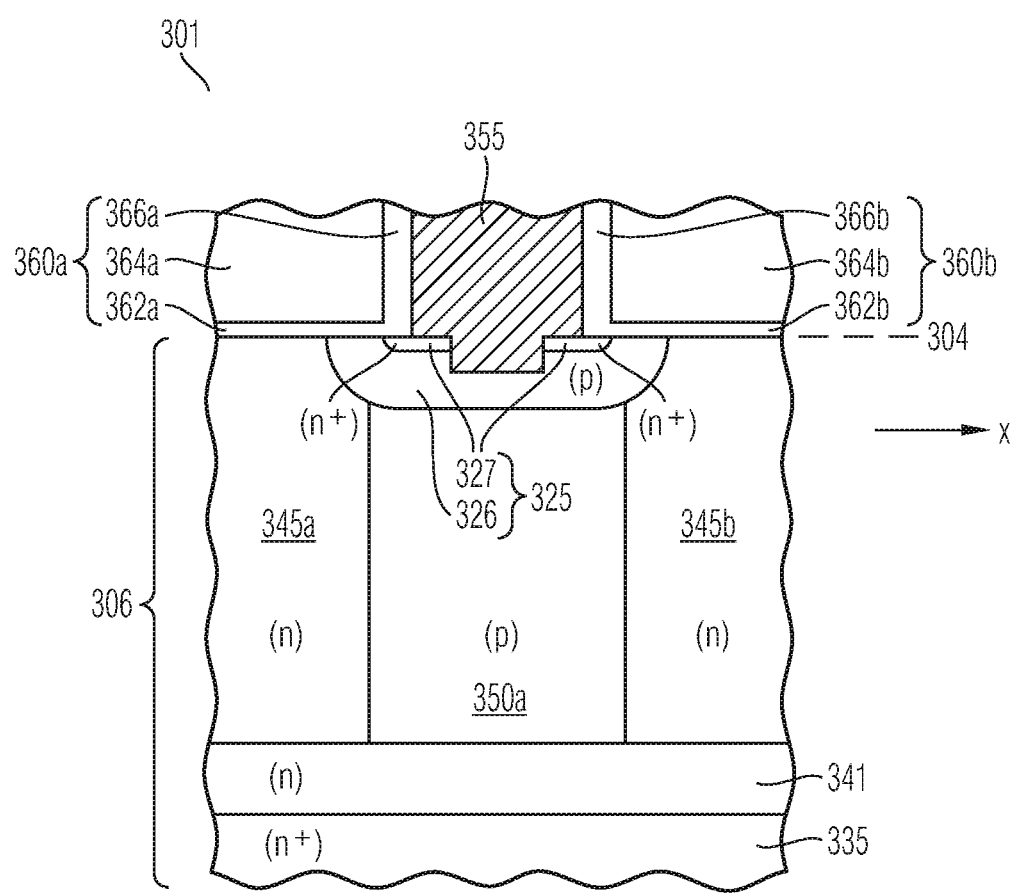
FIG. 10 illustrates a cross-sectional view of a super junction semiconductor device according to an embodiment of a vertical FET.

FIG. 10 illustrates a schematic cross-sectional view of a portion of a vertical FET 301 including n-type first semiconductor zones 345a, 345b and p-type second semiconductor zone 350a. These semiconductor zones are arranged sequentially along the lateral direction x in the sequence of first semiconductor zone 345a, second semiconductor zone 350a and first semiconductor zone 345b. The profile of concentrations of the first and second dopant species within these semiconductor zones may correspond to any of the respective examples above. The first semiconductor zones 345a, 345b constitute drift zones of FET 301. In a reverse operation mode of FET 301, free carriers may be removed from these regions and charge compensation between the first and second semiconductor zones may be achieved, i.e., the space charge of one of the first zones may electrically compensate the space charge of one of the second zones.

FET 301 includes a semiconductor structure 325 having a p-type body region 326 and n+-type source region 327 formed at a front surface 304 of a semiconductor body portion 306.

An n+-type drain 335 is formed at a back surface of the semiconductor body portion 306 opposite to the front surface 304. An n-type semiconductor zone 341 may be arranged between the first and second semiconductor zones 345*a*, 345*b*, 350*a* and the n+ type drain 345. The n-type semiconductor zone 341 may have a concentration of dopants equal to the first semiconductor zones 345*a*. According to another example, a concentration of dopants of the n-type semiconductor zone 341 may be higher or lower than the concentration of the first semiconductor zones 345*a*, 345*b*. The n-type semiconductor zone 341 may be a field stop zone configured to improve robustness such as avalanche robustness of FET 301.

At the front surface 304, a conductive structure 355 is electrically coupled to the semiconductor structure 325. The conductive structure 355 may include conductive elements such as contact plugs and conductive layers of conductive material such as metals and/or doped semiconductors. The conductive structure 355 is configured to provide an electrical interconnection between FET 301 and further elements such as further circuit devices or chip pads, for example.

FET 301 also includes gate structures 360*a*, 360*b* including gate dielectrics 362*a*, 362*b*, gate electrodes 364*a*, 364*b* and insulating layers 366*a*, 366*b*.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   transistor cells in a transistor cell area of a semiconductor body;
   a super junction structure in the semiconductor body, the super junction structure comprising a plurality of drift sub-regions and compensation sub-regions of opposite first and second conductivity types, respectively, and alternately arranged along a lateral direction, wherein each of the drift sub-regions include first dopants of the first conductivity type partially compensated by second dopants of the second conductivity type; and
   a termination area outside the transistor cell area between an edge of the semiconductor body and the transistor cell area,
   the termination area comprising first and third termination sub-regions of the first conductivity type, respectively, and a second termination sub-region of the second conductivity type sandwiched between the first and the third termination sub-regions along a vertical direction perpendicular to a first surface of the semiconductor body,
   wherein the first and the third termination sub-regions merge and fully surround the second termination sub-region.

2. The semiconductor device of claim 1, wherein an extension of the second termination sub-region along the vertical direction ranges between 20% and 80% of a vertical distance between a bottom side of the compensation sub-regions and the first surface.

3. The semiconductor device of claim 1, wherein the second termination sub-region is electrically floating.

4. The semiconductor device of claim 1, wherein the second termination sub-region is of the second conductivity type and includes dopants of the second conductivity type partially compensated by dopants of the first conductivity type.

5. The semiconductor device of claim 4, wherein each of the first and the third termination sub-regions is of the first conductivity type and includes dopants of the first conductivity type partially compensated by dopants of the second conductivity type.

6. The semiconductor device of claim 4, wherein a pair of dopants of the first and the second conductivity types corresponds to one of As and B, As and Al, Sb and B, Sb and Al, P and Al.

7. The semiconductor device of claim 1, wherein an extension of the second termination sub-region ranges between 3×p and 15×p, p being a pitch of the compensation sub-regions.

8. The semiconductor device of claim 1, wherein the second termination sub-region surrounds the transistor cell area.

9. The semiconductor device of claim 1, further comprising a field stop region of the first conductivity type between the edge of the semiconductor body and the second termination sub-region.

10. The semiconductor device of claim 9, wherein a vertical extension of the field stop region ranges between 50% and 110% of a vertical extension of the compensation sub-regions.

11. The semiconductor device of claim 1, further comprising a fourth termination sub-region of the second conductivity type sandwiched between the first termination sub-region and the first surface.

12. The semiconductor device of claim 1, further comprising a fifth termination sub-region of the second conductivity type sandwiched between the third termination sub-region and a semiconductor substrate of the first conductivity type.

13. The semiconductor device of claim 12, wherein a vertical distance between the fifth termination sub-region and the first surface ranges between 80% and 100% of a vertical distance between a bottom side of the compensation sub-regions and the first surface.

14. The semiconductor device of claim 1, wherein the semiconductor device is a vertical power transistor comprising a first load terminal contact at the first surface of the semiconductor body and a second load terminal contact at a second surface of the semiconductor body opposite to the first surface.

15. A semiconductor device, comprising:
   transistor cells in a transistor cell area of a semiconductor body;
   a super junction structure in the semiconductor body, the super junction structure comprising a plurality of drift sub-regions and compensation sub-regions of opposite first and second conductivity types, respectively, and alternately arranged along a lateral direction, wherein each of the drift sub-regions include first dopants of the first conductivity type partially compensated by second dopants of the second conductivity type; and
   a termination area outside the transistor cell area between an edge of the semiconductor body and the transistor cell area, the termination area comprising first and third termination sub-regions of the first conductivity type, respectively, and a second termination sub-region of the second conductivity type sandwiched between the first and the third termination sub-regions along a vertical direction perpendicular to a first surface of the semiconductor body, wherein the semiconductor device further comprises a fifth termination sub-region of the second conductivity type sandwiched between the third termination sub-region and a semiconductor substrate of the first conductivity type.

16. A semiconductor device, comprising:

transistor cells in a transistor cell area of a semiconductor body;

a super junction structure in the semiconductor body, the super junction structure comprising a plurality of drift sub-regions and compensation sub-regions of opposite first and second conductivity types, respectively, and alternately arranged along a lateral direction, wherein each of the drift sub-regions include first dopants of the first conductivity type partially compensated by second dopants of the second conductivity type; and a termination area outside the transistor cell area between an edge of the semiconductor body and the transistor cell area, the termination area comprising first and third termination sub-regions of the first conductivity type, respectively, and a second termination sub-region of the second conductivity type sandwiched between the first and the third termination sub-regions along a vertical direction perpendicular to a first surface of the semiconductor body, wherein the second termination sub-region is electrically floating.

* * * * *